United States Patent
Chen

(10) Patent No.: US 7,997,912 B2
(45) Date of Patent: Aug. 16, 2011

(54) THREE-DIMENSIONAL CONNECTOR FOR A COORDINATE INPUT DEVICE

(75) Inventor: Chih-Cheng Chen, Yuan Kang Industrial District (TW)

(73) Assignee: Super Elite Technology Company Limited, Tainan (TW)

(*) Notice: Subject to any disclaimer, the term of this patent is extended or adjusted under 35 U.S.C. 154(b) by 0 days.

(21) Appl. No.: 12/793,379

(22) Filed: Jun. 3, 2010

(65) Prior Publication Data

US 2010/0240248 A1 Sep. 23, 2010

Related U.S. Application Data

(62) Division of application No. 11/968,166, filed on Jan. 1, 2008, now Pat. No. 7,731,505.

(51) Int. Cl.
*H01R 13/44* (2006.01)

(52) U.S. Cl. ................................ 439/150; 361/749
(58) Field of Classification Search .............. 439/150, 439/67, 77; 361/749; 345/173
See application file for complete search history.

(56) References Cited

U.S. PATENT DOCUMENTS

| | | | |
|---|---|---|---|
| 5,419,038 A * | 5/1995 | Wang et al. ................ 29/830 |
| 6,770,813 B1 * | 8/2004 | Ramsagar et al. .......... 174/525 |
| 6,992,864 B2 * | 1/2006 | Kaneko et al. ............ 360/264.2 |
| 7,679,922 B2 * | 3/2010 | Miyata ..................... 361/749 |
| 7,800,001 B2 * | 9/2010 | Hamada et al. ............ 174/254 |

* cited by examiner

*Primary Examiner* — Thanh-Tam T Le

(57) ABSTRACT

A three-dimensional connector, which is used by a coordinate input device of a touch pad, has a flat conductor cable with an end being connected to the touch pad and another end forming a soldered conductive contact head perpendicular to the flat conductor cable to pass through a support to shorten a length of said conductor cable and enhance electro-conductibility of the connector.

2 Claims, 6 Drawing Sheets

THREE-DIMENSIONAL CONNECTOR FOR A COORDINATE INPUT DEVICE

The present application is a divisional application of application Ser. No. 11/968,166 filed on Jan. 1, 2008

BACKGROUND OF THE INVENTION

1. Field of the Invention

The present invention is related to a three-dimensional connector for a coordinate input device and particularly to a three-dimensional connector, which is connected to and perpendicular to a flat conductor cable to enhance compactness.

2. Brief Description of the Related Art

There are conventional touch pads available in the market such as the resistance touch pad, the capacitance touch pad, the infrared touch pad, the supersonic touch pad and the inductance touch pad. The connecting end of the flat cable is provided with either the male-female connector or the locking type connector.

However, the common feature of the previous connection ways is in that a flat cable with an optional length is connected to one of connectors of a control card and another connector of the control card is connected to an input port of a personal computer with another conductor cable. Although the conventional connecting ways are simple and convenient, deficiencies such as incomplete contacting, the flat cable being excessive long, having weak signal and the flat cable loosening and breaking easily keep bothering the users and the suppliers.

SUMMARY OF THE INVENTION

In order to overcome the deficiencies of the preceding prior art, an object of the present invention is to provide a three-dimensional connector for a coordinate input device with which the flat cable can be connected perpendicularly to enhance steadiness in use.

Another object of the present invention is to provide a three-dimensional connector for a coordinate input device with which the flat cable can be shortened to enhance compactness and integrity of the flat cable connection.

A further object of the present invention is to provide an easily assembled three-dimensional connector for a coordinate input device with lower production cost.

Accordingly, a three-dimensional connector for a coordinate input device in accordance with the present invention includes a flat conductor cable. The flat conductor cable has an end connecting with the touch pad and another end providing a plurality of conductive lines. Each of the conductive lines corresponds to and is perpendicularly penetrated with a connecting pin; the connecting pin has a head section to press-fit with the flat conductor cable and extends through a slot, which is provided at the support plate of the touch pad, to act as a contact such that the flat conductor cable is capable of transmitting electronic signal along a direction perpendicular to the flat conductor cable. Hence, the flat conductor cable can be connected firmly without loosening so as to enhance compactness of the three-dimensional connector substantially.

Further, a three-dimensional connector for a coordinate input device in accordance with the present invention includes a flat conductor cable with a first end being connected to the touch pad and a second end passing through a slot, which is provided at the support and disposed next to a side of the support plate, and forming a naked-copper connector at the bottom of said support plate.

In addition, a three-dimensional connector for a coordinate input device includes a flat conductor cable with a first end being connected to the touch pad and a second end forming a soldered conductive contact head perpendicular to the flat conductor cable to pass through a slot, which is provided at the support disposed next to a side of said support plate, such that a shortened length of said conductor cable is obtained.

BRIEF DESCRIPTION OF THE DRAWINGS

The detail structure, the applied principle, the function and the effectiveness of the present invention can be more fully understood with reference to the following description and accompanying drawings, in which.

DETAILED DESCRIPTION OF THE INVENTION

Figure 1:
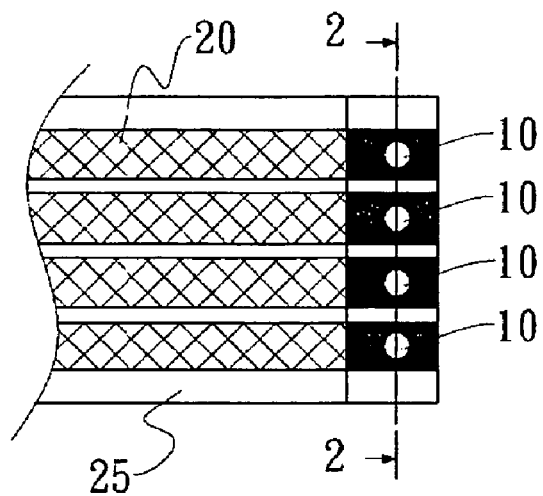
FIG. 1 is a fragmentary front view of the first embodiment of a three-dimensional connector for a coordinate input device according to the present invention.
Figure 2:
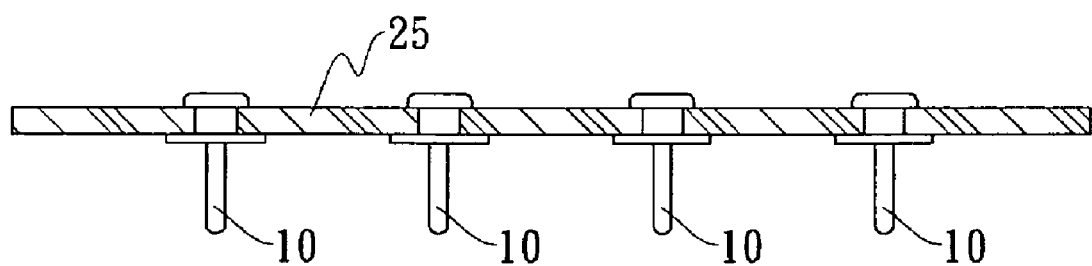
FIG. 2 is a sectional view along line 2-2 of FIG. 1.
Figure 3:
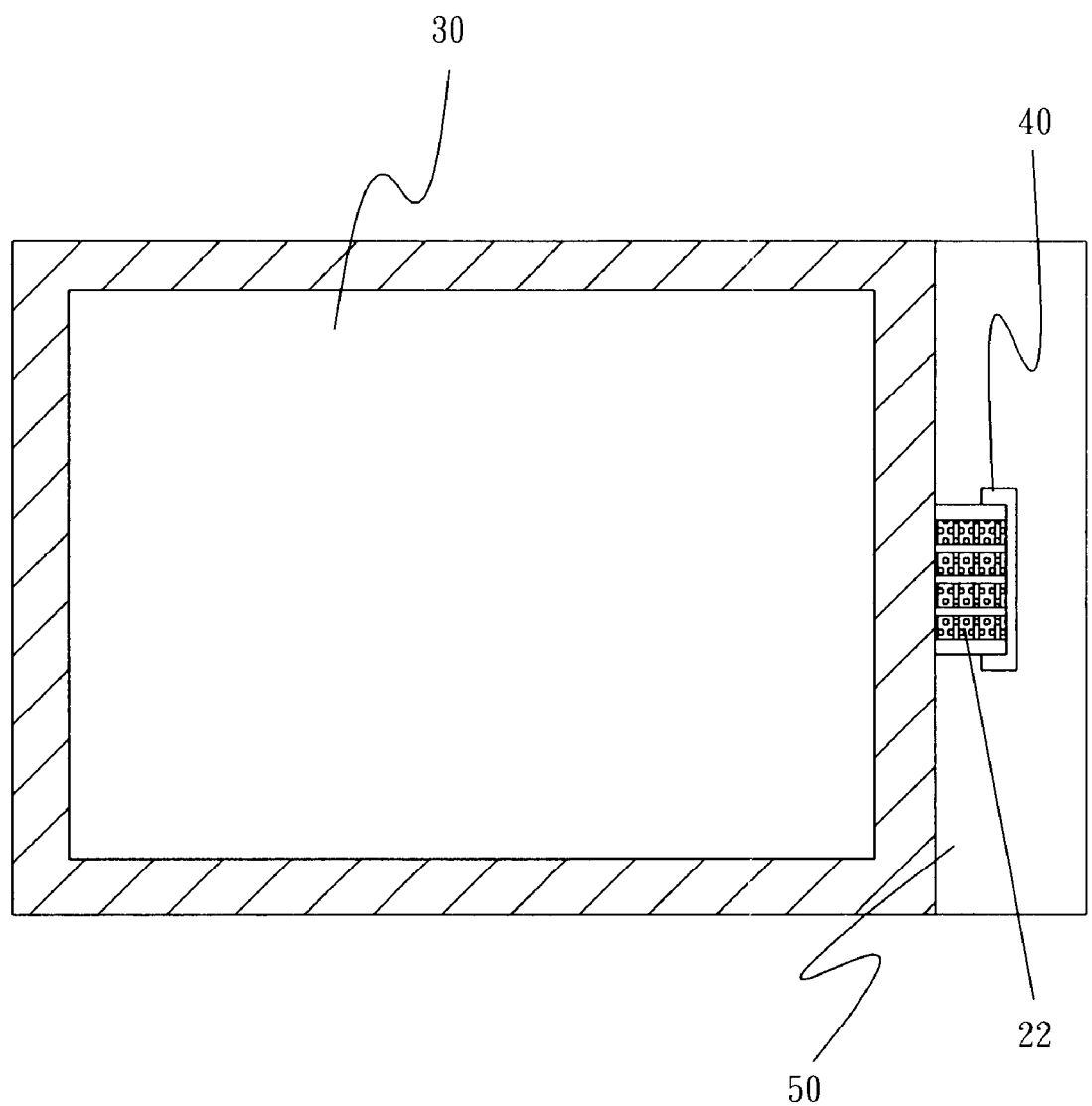
FIG. 3 is a partly sectional view illustrating the first embodiment of a three-dimensional connector for a coordinate input device according to the present invention.
Figure 4:
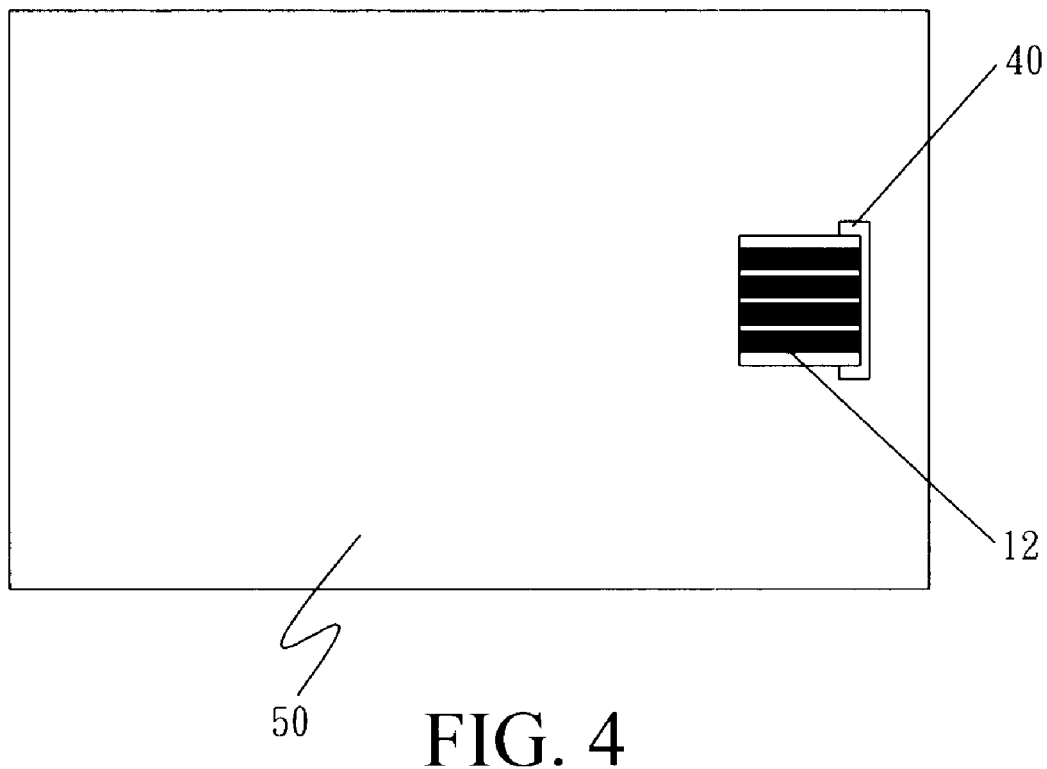
FIG. 4 is a rear view of the forward arrangement type of the second embodiment according to the present invention.
Figure 5:
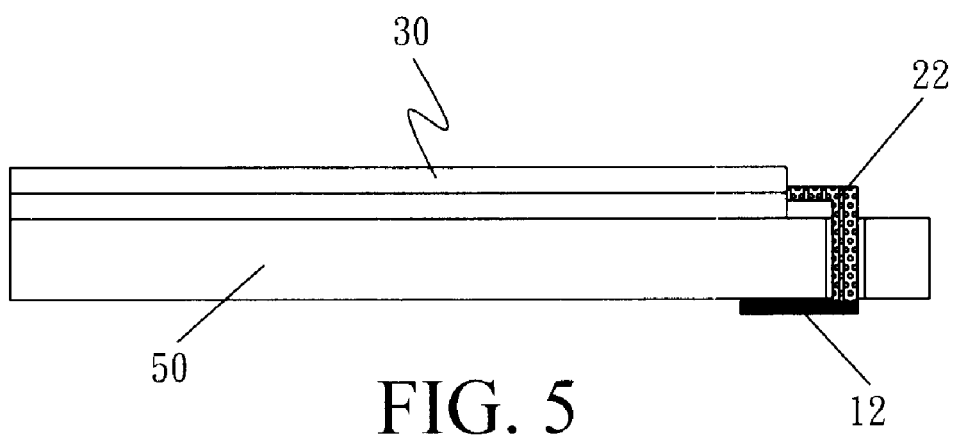
FIG. 5 is a side view of the forward arrangement type of the second embodiment according to the present invention.

Referring to FIGS. 1 and 2, the first embodiment of a three-dimensional connector for a coordinate input device according to the present invention provides a flexible flat conductor cable 25 such as flexible print circuit board (FPC or flexible PCB) or flexible flat cable (FFC) with an end thereof connecting with a touch pad (not shown) and another end thereof having a plurality of conductive lines 20. Each of the conductive lines 20 is pressingly attached with a vertical guiding conductor pin 10, and the vertical guiding conductor pin 10 perpendicularly extends through the flexible flat conductor cable 25 such that the flat conductor cable 25 is capable of transmitting electronic signals in a direction perpendicular to it. Because of the vertical guiding conductor pin 10, the structure of the flat conductor cable 25 is simplified substantially such that the length of the flat conductor cable 25, and the area and time for setting up connection with the flat conductor cable 25 can be reduced advantageously. In addition, the flat conductor cable 25 can be fabricated with much easier way.

Figure 6:
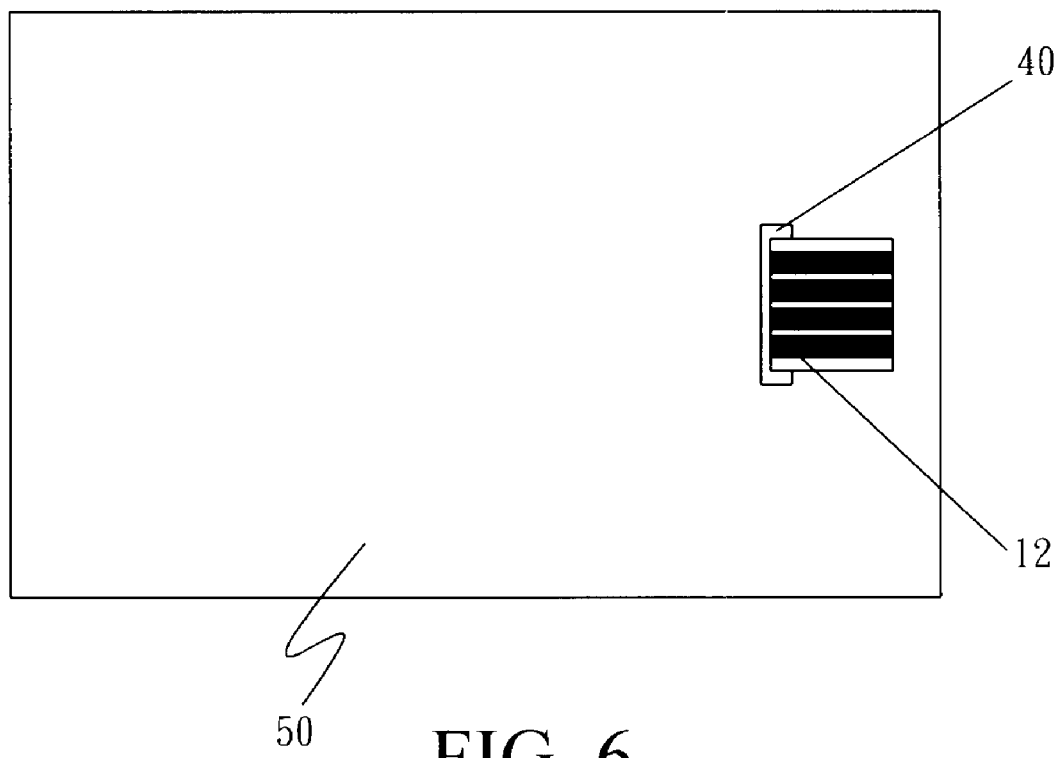
FIG. 6 is a rear view of the backward arrangement type of the second embodiment according to the present invention.
Figure 7:
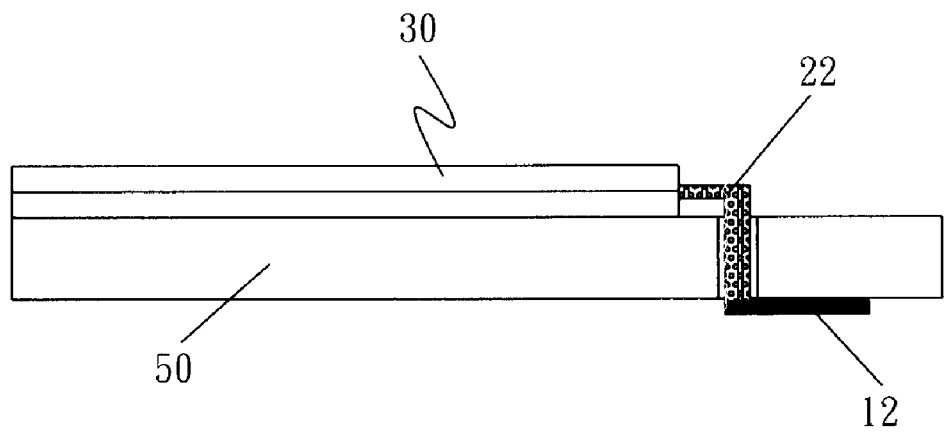
FIG. 7 is a side view of the backward arrangement type of the second embodiment according to the present invention.

Referring to FIGS. 3 to 7, the second embodiment of the present invention is illustrated. It can be seen in FIGS. 3 to 5 that a three-dimensional connector is formed of a flexible flat conductor cable 22 such as a flexible print circuit board (FPC or flexible PCB) or a flexible flat cable (FFC) with a naked-copper contact type connector 12 instead of flat plane type connector. An end of the flexible flat conductor cable 22 is connected to a lateral side of a touch pad 30 disposed on the top of a support plate 50. The other end of the flexible flat conductor cable 22 is connected to the naked-copper contact type connector 12 which is attached to the bottom of the support plate 50. The support plate 50 has a slot 40 disposed between the touch pad 30 and a lateral side of the support plate 50 for the other end of the flexible flat conductor cable 22 being capable of passing through the slot 40 and extending to the bottom of the support plate 50 and being joined to an end of the naked-copper contact type connector 12 right under the slot 40. It is noted that the other end of the necked-copper contact type connector 12 is disposed to extend away from the lateral side of the support plate. The arrangement of the copper contact type connector 12 illustrated in FIGS. 6 and 7 is similar to the arrangement shown in FIGS. 4 and 5. The difference of the arrangement shown in FIGS. 6 and 7 is in that the other end of the naked-copper contact type connector 12 is disposed to extend toward the lateral side of the support plate 50. The three-dimensional connector of the second embodiment has simplified the structure of the flat cable such that it is easier for the flat cable being connected. Further, the naked-copper contact type connector 12 is capable of transmitting the electronic signal of the touch pad 30 accurately and it lowers the chance of the signal being degraded and enhances the life span of the touch pad 30.

Figure 8:
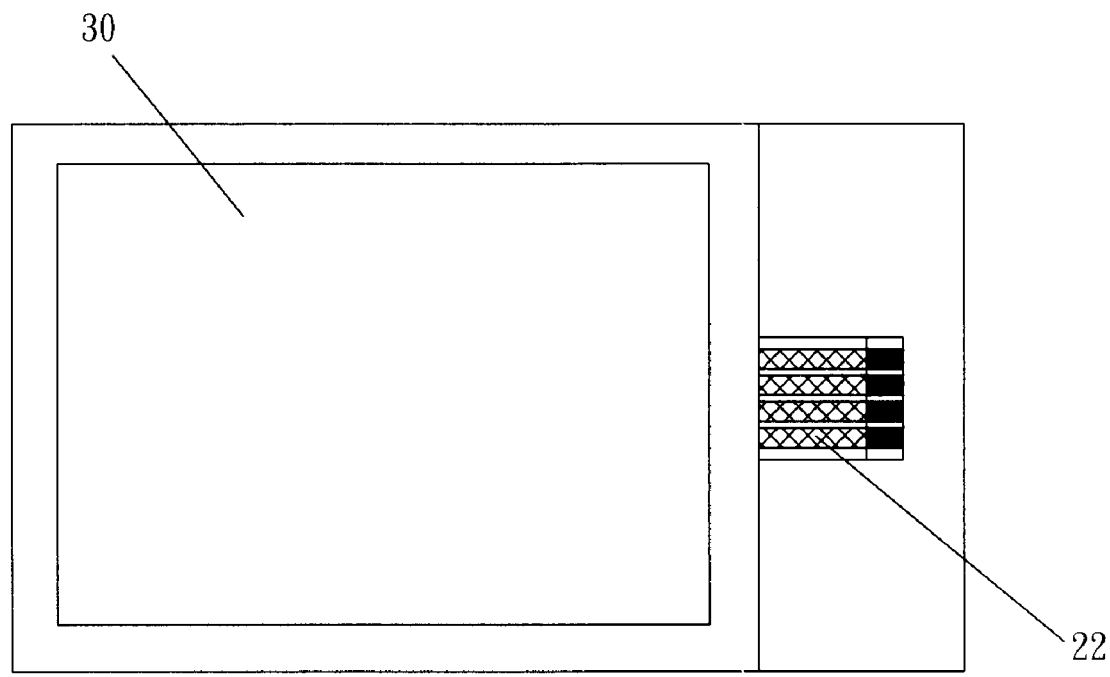
FIG. 8 is a plan view of the third embodiment according to the present invention.
Figure 9:
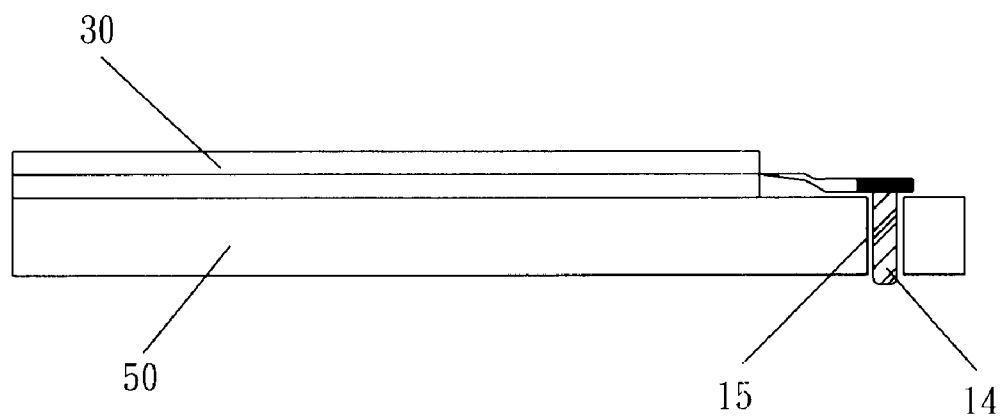
FIG. 9 is a side view of the third embodiment according to the present invention.

Referring to FIGS. 8 and 9, the third embodiment of the present invention is illustrated. The three-dimensional connector of the third embodiment provides a flexible flat conductor cable 22 such as flexible PCB or FFC with an end thereof being connected to a touch pad 30 on a support plate 50 and another end of the flexible flat conductor cable 22 is soldered with a conductive contact head 14, which is perpendicular to the flexible flat conductor cable 22. A slot 15 is provided at the support plate 50 corresponds to the conductive contact head 14 for the conductive contact head 14 passing through to perform task of contact. In this way, the flexible flat conductor cable 22 can be shortened substantively and the electro-conductibility thereof is much better than the copper contact.

Figure 10:
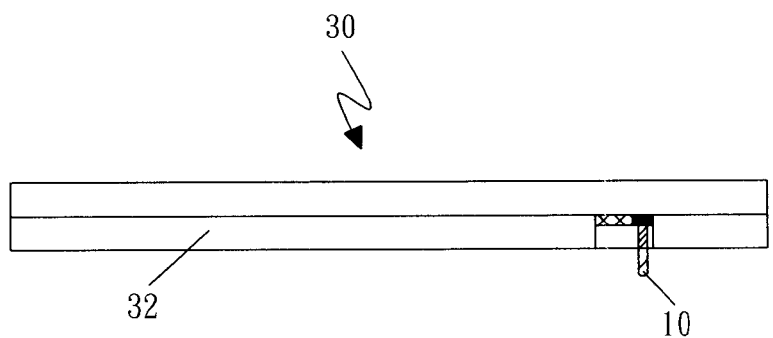
FIG. 10 is a side view of the fourth embodiment according to the present invention.
Figure 11:
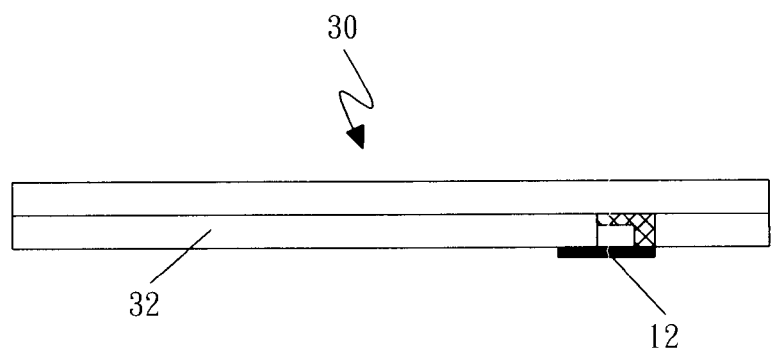
FIG. 11 is a side view of the fifth embodiment according to the present invention.
Figure 12:
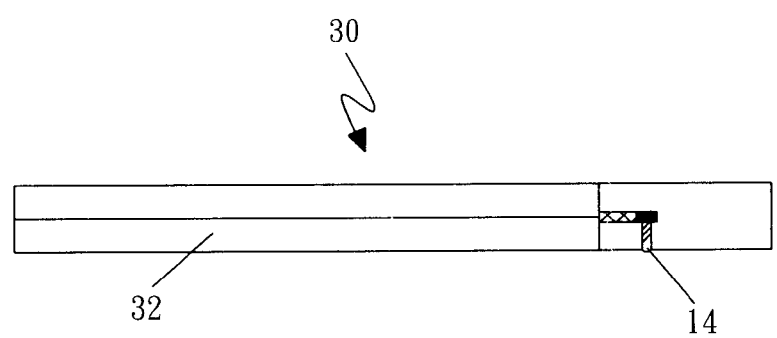
FIG. 12 is a side view of the third embodiment according to the present invention.

Referring to FIGS. 10 to 12, the lower plate 32 of the touch pad 30 is extended to replace the support plate shown in the previous embodiments of the present invention. Hence, the fourth embodiment shown in FIG. 10 can be used instead of the first embodiment shown in FIGS. 1 and 2. The fifth embodiment can be used for replacing the second embodiment shown in FIGS. 3 to 7. The sixth embodiment can be used instead of the third embodiment shown in FIGS. 8 and 9.

It is appreciated that a three-dimensional connector for a coordinate input device according to the present invention is provided in a form of a vertical guide pin, a connecting head or a vertical conductive contact to allow the connecting flat cable of a touch pad being connected firmly without loosening or breaking and shortening length of the flat cable such that deficiencies of the conventional connector such as undesirable contact, excessive length, weak signal transmission, frequent loosening and breaking can be overcome effectively.

While the invention has been described with referencing to the preferred embodiments thereof, it is to be understood that modifications or variations may be easily made without departing from the spirit of this invention, which is defined by the appended claims.

What is claimed is:

1. A three-dimensional connector, which is used by a coordinate input device having a touch pad disposed on the top of a support plate, comprising:
    a flexible flat conductor cable with a first end and a second end, wherein the first end is connected to a lateral side of said touch pad;
    a slot being disposed at said support plate;
    a soldered conductive contact head corresponding to the slot with a third end attached to the second end and a fourth end extending through said slot in such a way of the soldered conductive contact head being perpendicular to said flat conductor cable for shortening said conductor cable and enhancing electro-conductibility of the connector.

2. The three-dimensional connector according to claim 1 wherein the support plate is a lower plate of the touch pad with an extension part to support the flat conductor cable.

* * * * *